United States Patent
Caroff et al.

(10) Patent No.: US 9,754,856 B2
(45) Date of Patent: Sep. 5, 2017

(54) APPARATUS COMPRISING A FUNCTIONAL COMPONENT LIKELY TO BE THERMALLY OVERLOADED DURING THE OPERATION THEREOF AND A SYSTEM FOR COOLING THE COMPONENT

(71) Applicants: Commissariat A L'Energie Atomique Et Aux Energies Alternatives, Paris (FR); Schneider Electric Industries SAS, Rueil-malmaison (FR)

(72) Inventors: Tristan Caroff, Gieres (FR); Mitova Radoslava, Meylan (FR); Julia Simon, Genoble (FR)

(73) Assignees: COMMISSARIAT A L'ENERGIE ATOMIQUE ET AUX ENERGIES, Paris (FR); SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 0 days.

(21) Appl. No.: 15/022,633

(22) PCT Filed: Aug. 22, 2014

(86) PCT No.: PCT/IB2014/064024
§ 371 (c)(1),
(2) Date: Mar. 17, 2016

(87) PCT Pub. No.: WO2015/040514
PCT Pub. Date: Mar. 25, 2015

(65) Prior Publication Data
US 2016/0233145 A1 Aug. 11, 2016

(30) Foreign Application Priority Data
Sep. 23, 2013 (FR) .................................. 13 59095

(51) Int. Cl.
*H05K 7/20* (2006.01)
*H01L 23/38* (2006.01)
(Continued)

(52) U.S. Cl.
CPC .......... *H01L 23/38* (2013.01); *H01L 23/3672* (2013.01); *H01L 23/3675* (2013.01);
(Continued)

(58) Field of Classification Search
CPC . G06F 1/181–1/182; H05K 7/20218–7/20381;
(Continued)

(56) References Cited

U.S. PATENT DOCUMENTS 5,596,228 A 1/1997 Anderton et al.
6,570,362 B1 5/2003 Estes et al.
(Continued)

FOREIGN PATENT DOCUMENTS

EP 1162659 A2 12/2001
EP 1331838 A2 7/2003
(Continued)

OTHER PUBLICATIONS

International Search Report for PCT/IB2014/064024 dated Jan. 16, 2015.

*Primary Examiner* — Anthony Haughton
*Assistant Examiner* — Razmeen Gafur
(74) *Attorney, Agent, or Firm* — Cooper Legal Group LLC

(57) ABSTRACT

The invention relates to an apparatus comprising a functional component likely to be thermally overloaded during the operation thereof, and a system for cooling the component, comprising: a thermoelectric module comprising a cold surface and a hot surface, the cold surface being thermally coupled with the component; a heat sink thermally coupled with the hot surface of the module, the heat sink
(Continued)

including an exchange surface with the surrounding environment and at least one cell containing a phase-change material (PCM), the PCM material contained in the cell or cells being suitable for melting when the heat released from the cold surface of the module is that of the thermally overloaded component, the exchange surface being suitable for bringing the PCM material from the molten phase to the solid phase thereof when the heat released from the cold surface of the module is that of the operational component which is not thermally overloaded.

18 Claims, 3 Drawing Sheets

(51) Int. Cl.
H01L 23/427 (2006.01)
H01L 23/367 (2006.01)
H01L 23/373 (2006.01)
H01L 23/473 (2006.01)

(52) U.S. Cl.
CPC ........ *H01L 23/373* (2013.01); *H01L 23/3737* (2013.01); *H01L 23/427* (2013.01); *H01L 23/4275* (2013.01); *H01L 2924/0002* (2013.01)

(58) Field of Classification Search
CPC ........... H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 8,087,254 B2 | 1/2012 | Arnold | |
| 2004/0042178 A1* | 3/2004 | Gektin | H01L 23/42 361/705 |
| 2005/0201062 A1* | 9/2005 | Matteson | H01L 23/42 361/704 |
| 2006/0088271 A1 | 4/2006 | Ghoshal | |
| 2006/0104035 A1* | 5/2006 | Vasoya | H01L 23/36 361/704 |
| 2008/0101025 A1* | 5/2008 | Harris | H01L 23/433 361/704 |
| 2009/0129026 A1* | 5/2009 | Baek | H01L 23/3672 361/710 |
| 2009/0283902 A1* | 11/2009 | Bezama | H01L 23/3675 257/713 |
| 2010/0319876 A1* | 12/2010 | Yoshida | H01L 23/34 165/80.2 |
| 2010/0321895 A1* | 12/2010 | Hill | H05K 7/20472 361/715 |
| 2011/0069525 A1* | 3/2011 | Fukumizu | G11C 13/0004 365/63 |
| 2011/0103020 A1* | 5/2011 | Dangelo | B82Y 10/00 361/709 |
| 2011/0132576 A1* | 6/2011 | Bugby | F28D 1/0477 165/104.14 |
| 2012/0042646 A1* | 2/2012 | Tice | F25D 3/00 60/529 |
| 2012/0049341 A1* | 3/2012 | Bezama | H01L 23/3675 257/713 |
| 2012/0127665 A1* | 5/2012 | Prete | G06F 1/20 361/704 |
| 2012/0152511 A1* | 6/2012 | Chang | B60H 1/00428 165/202 |
| 2012/0192574 A1* | 8/2012 | Ghoshal | F25B 21/02 62/3.2 |
| 2012/0206880 A1* | 8/2012 | Andres | H01L 23/4275 361/700 |
| 2012/0227926 A1* | 9/2012 | Field | F24D 11/003 165/10 |
| 2012/0261106 A1* | 10/2012 | Kelly | F28F 3/022 165/185 |
| 2012/0276327 A1* | 11/2012 | Cola | B01J 23/745 428/119 |
| 2012/0281359 A1* | 11/2012 | Arney | H05K 7/20645 361/701 |
| 2012/0287582 A1* | 11/2012 | Vinciarelli | H01R 43/24 361/728 |
| 2012/0299173 A1* | 11/2012 | Mohammed | H01L 23/3677 257/686 |
| 2012/0306088 A1* | 12/2012 | Bartley | H01L 23/3677 257/773 |
| 2012/0325454 A1* | 12/2012 | Iwai | H01L 23/373 165/185 |

FOREIGN PATENT DOCUMENTS

| | | |
|---|---|---|
| EP | 2505913 A1 | 10/2012 |
| WO | 0217471 A1 | 2/2002 |

* cited by examiner

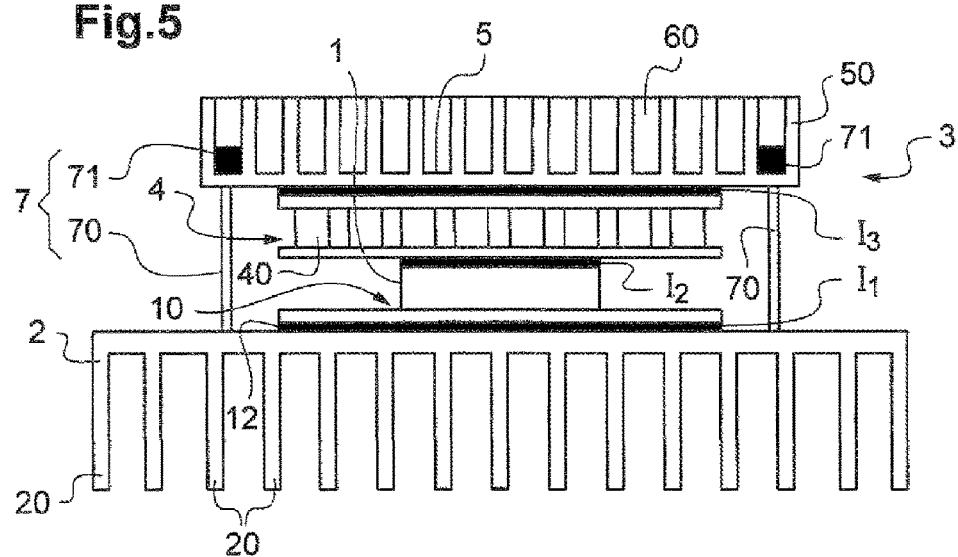
Fig.5
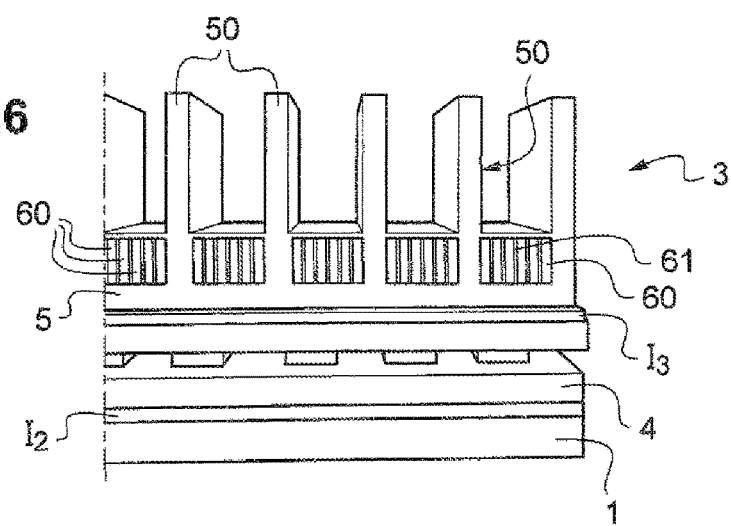
Fig.6
Fig.7
(PRIOR ART)
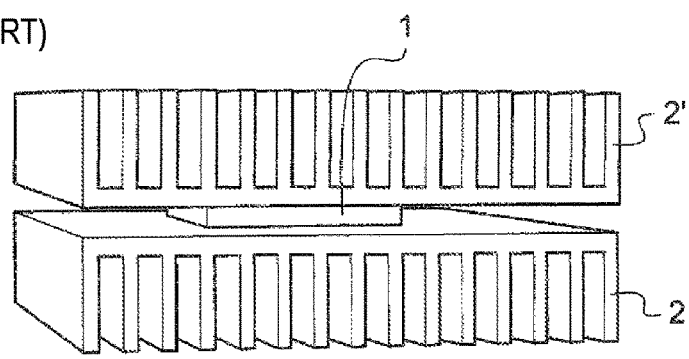

APPARATUS COMPRISING A FUNCTIONAL COMPONENT LIKELY TO BE THERMALLY OVERLOADED DURING THE OPERATION THEREOF AND A SYSTEM FOR COOLING THE COMPONENT

TECHNICAL FIELD

The present invention relates to a device comprising a functional component liable to be thermally overloaded during the operation thereof and to a system for cooling the component.

The invention pertains to the production of an improved cooling system which, while being of limited size, allows thermal overloading of the component to be absorbed.

Although described with reference to the application of cooling power electronics components, the invention is equally applicable to the cooling of any functional component liable to be thermally overloaded during the operation thereof over periods of up to a few tens of minutes. Thus, the functional component may be a computer, a microprocessor, or a hot plate for which it is sought to absorb temperature overrun when a PID ("proportional-integral-derivative") controller is used for temperature control.

It is specified that in the context of the invention, "functional component" is understood to mean a single component element or multiple component elements that are mutually associated in order to carry out a given function in a device. For example, it may be a question of an assembly of multiple power electronics component elements that are assembled on one and the same substrate and mutually associated.

It is also specified that "thermal overload" is understood to mean operation of a functional component over a given period at temperatures high enough to be deleterious to the lifespan thereof, or even to immediately impair the working order thereof. Stated otherwise, it is understood to mean spikes in thermal power to which the functional component is subjected over a given period and which are large enough to be detrimental to the working order of said component, or at the very least to reduce the lifespan thereof. Typically, a power electronic component based on silicon (Si), silicon carbide (SiC) or gallium nitride (GaN) is liable to be under thermal overload when it heats up by a few watts over a period of a few minutes.

It is also specified that "nominal regime" is understood to mean operation of a functional component over a given period which does not cause the thermal overloading thereof.

It is also specified that "thermoelectric module" or TEC module is understood to mean a module that when passed through by an electric current generates a temperature difference. It is therefore a question of a module that is used in an active mode, also usually called a Peltier module as it implements the Peltier effect.

It is finally specified that "heat sink" is understood to mean a device the exchange surface of which with the surrounding environment allows at least some of the heat emitted by the functional component to be dissipated by convection. It may thus be a question of a heat sink in the usual sense in power electronics, i.e. a device intended to facilitate the removal of the heat dissipated by power semiconductor elements.

PRIOR ART

Currently, in depth investigations are being conducted regarding integration of novel power electronic components based on Si, SiC or GaN into various types of devices.

However, it has already been demonstrated that, in certain electrical devices into which they have been integrated, these power components are liable to intermittently be subjected to electrical overloads and therefore to surplusses in electrical power and hence in heat to be removed. Typically, insulated gate bipolar transistors (IGBTs) may be powered with a current of about 110% of the nominal current over relatively short periods of about 1 to 5 minutes, this possibly degrading their junctions.

Thus, in addition to a cooling system dimensioned for operation under nominal conditions, it appears to be necessary to provide a supplementary cooling system in order to limit the temperatures to which the components are subjected during these overloads, in particular to limit the temperatures of the junctions.

Conventionally, the cooling system for operation in the nominal regime consists of a heat sink equipped with fins, hereafter called the nominal heat sink, which is rigidly fixed to a main face of the substrate that bears the power electronics components.

To form the supplementary cooling system, i.e. that dedicated to cooling the large heat spikes to which the power components are subjected, it is possible to envisage various existing solutions.

It is first of all possible to conceive of solely adding a conventional finned heat sink, by rigidly fixing it to the other main face of the substrate. However, to do so would grossly over-dimension the complete cooling system, as the intrinsic volume of the supplementary heat sink would be considerable, typically equal to that of the nominal heat sink.

It is also possible to conceive of solely adding a thermoelectric module, in particular a Peltier module, to the nominal heat sink. However, the hot face of a thermoelectric module would release a very large quantity of heat in the event of large heat peaks. The efficiency of a thermoelectric module used alone is therefore limited to thermal powers to be removed which remain relatively low.

It is lastly possible to conceive of solely adding, to the nominal heat sink, a cell containing a phase-change material (PCM). However, this is not possible in the case where substantial thermal powers are to be removed, as, in this case, the overheating temperature reached by the component gets considerably higher than the melting point of the PCM material since it is not able to rapidly absorb the thermal overload.

Component cooling systems associating the elements of the various aforementioned solutions are already known from the literature.

Thus, patent application EP 2505913A1 describes a system for cooling a heat source in which the heat emitted by the source is transferred to a cell containing a phase-change material (PCM) via a single first thermal switch, such as a microelectromechanical system (MEMS). As soon as the PCM material undergoes a phase change, the first switch is opened and the actuation of a second thermal switch, which may be a Peltier module, allows the heat stored by the PCM material to be dissipated, in particular via a conventional heat sink. A system such as this is not suitable for absorbing spikes of thermal power from the source, as the first thermal switch only directs the heat released by the source to the PCM material so as to achieve the phase change thereof. Stated otherwise, there can be effectively no pumping of any thermal power spikes that occur at the source and the PCM material, the latter moreover effectively being dimensioned only to ensure a uniform temperature of the source before the nominal operation thereof.

Patent application US 2006/0088271 describes a system for cooling an electronic or optoelectronic component in which, prior to the component being put into operation, a TEC module is triggered in order to transfer the heat from the base of the component to a PCM material encapsulated in a thermally insulating encapsulant. Here again, in the event of the component being thermally overloaded, there may be no absorption thereof, the PCM material being dimensioned only to ensure a uniform temperature of the source before the nominal operation thereof.

U.S. Pat. No. 8,087,254 describes a system for cooling the heat emitted by the head of a person, integrated into a helmet, in which a heat pipe allows the heat to be removed to a remote area, the heat thus removed being transferred by means of thermoelectric modules, either to a heat sink or to a PCM material. Here, no actual storage of heat is possible and the system described is not able to absorb spikes of thermal power.

There is therefore a need to improve the system for cooling a functional component liable to be thermally overloaded during the operation thereof, in particular with a view to effectively absorbing the power spikes during a thermal overload without having to substantially over-dimension said system.

The general aim of the invention is to partially meet this need.

A particular aim of the invention is to propose a system for cooling a power electronic component which meets the general aim, which may be integrated into the packaging of the component, and which employs a conventional heat sink for operation in the nominal regime.

SUMMARY OF THE INVENTION

In order to do this, a first subject of the invention is a device comprising a functional component, in particular an electronic component, liable to be thermally overloaded during the operation thereof, and a system for cooling the component, the cooling system comprising:
- a thermoelectric module, comprising two main faces, one called the cold face, and the other called the hot face, the cold face being thermally coupled to the component;
- a first heat sink, thermally coupled to the hot face of the thermoelectric module, the heat sink comprising an exchange surface with the surrounding environment and furthermore at least one cell containing a phase-change material (PCM), the PCM material contained in the cell(s) being adapted so as to melt when the heat released from the cold face of the thermoelectric module is that of the component under thermal overload, the exchange surface being adapted so as to return the PCM material from the molten phase thereof to the solid phase thereof when the heat released from the cold face of the thermoelectric module is that of the component in operation which is not under thermal overload.

Stated otherwise, according to the invention, one portion of the cooling system is solely dedicated to the absorption of the excess heat generated in the transient regime (thermal overload) of the component operation.

When the component is under thermal overload, due, for example, to it being electrically overloaded, the thermoelectric module, which is thermally coupled to the component, is turned on, i.e. powered by an electrical current. The thermoelectric module immediately pumps and transfers surplus heat to the PCM material encapsulated in the first heat sink. This surplus heat is therefore stored by the PCM material of changed phase.

Upon the component returning to its nominal operating regime, the heat absorbed by the PCM material is discharged relatively slowly into the surrounding environment by means of the first heat sink. The latter may be substantially smaller than a second heat sink, conventionally used to cool the component under nominal operating conditions.

According to one advantageous embodiment, the functional component is an electronic component, preferably a power electronic component based on silicon (Si), silicon carbide (SiC) or gallium nitride (GaN). By virtue of the invention, it is possible to obtain a system for cooling a power electronic component both during the nominal operation thereof and during operation thereof under thermal overload, which is small in size and integratable into the packaging of the component.

Preferably, the thermoelectric module is a Peltier module. A Peltier module actually behaves like a heat pump and allows heat to be transferred immediately. Preferably, when the component is a power electronic component operating under thermal overload in a temperature range of 20-200° C., the thermoelectric material used is preferably bismuth telluride. It is also possible to envisage using other materials, such as silicon-germanium alloys (SiGe), silicides, skutterudites, etc.

To dimension the Peltier module optimally, the following rules should be respected. First of all, there is an optimum current above which the heat loss P due to Joule heating, given by the equation $P=R*I^2$, where R is the thermal resistance of the module and I is the current passing therethrough, is greater than the quantity of heat absorbed by the Peltier effect in the module and causes overall heating of the device.

Likewise, there is an optimum thermal resistance R of the Peltier module allowing the component to be optimally cooled in operation: an overly low thermal resistance thermally short-circuits the hot and cold faces of the module, while conversely an overly high thermal resistance induces an increase in the temperature of the component in operation when no current is passing through the module.

Thus, optimally, in the context of the invention, the Peltier module is operated at the optimum thermal resistance thereof and under an electric current below the optimum current.

Preferably, when the component is a power electronic component, the thermal resistance of the thermoelectric module is between 1 and 10 kelvin per watt (K/W) for a power of thermal overload of the component of 10 W.

According to one advantageous embodiment, the PCM material is of the solid-liquid type.

The preferred PCM material may be chosen from among molten salts ($MgCl_2.6H_2O$ or $Mg(NO_3).6H_2O$ for example); fatty acids, preferably myristic acid ($C_{14}H_{28}O_2$), palmitic acid ($C_{16}H_{32}O_2$), stearic acid ($C_{18}H_{36}O_2$); waxes or paraffins ($C_nH_{2n+2}$) and their derivatives; and metals with low melting points based on In, Ga, Bi and Sn, preferably $Bi_{67}In_{33}$, SnIn, BiSnPb, GaInSn.

When the component is a power electronic component, the PCM material contained in the cell(s) is preferably adapted so as to store a quantity of heat of between 0.1 to 5 kJ.

According to one advantageous embodiment, the first heat sink comprises a plurality of main fins, a cell containing the PCM material being delimited by two consecutive main fins.

Preferably, metal fibres or carbon nanotubes are embedded in the PCM material.

According to one advantageous variant, the first heat sink comprises a plurality of secondary fins arranged within a cell containing the PCM material.

According to one advantageous embodiment, the cold face of the thermoelectric module has an interface with the component, and the hot face of the thermoelectric module has an interface with a face of the first heat sink.

The interfaces are preferably produced by applying a thermal interface material chosen from a thermal adhesive or an adhesive having a metal matrix (Sn), or by soldering using a solder based on indium (In) or tin (Sn).

According to one advantageous embodiment, the component is borne by a face of a substrate, another face of the substrate interfacing with a second heat sink, of the finned type.

According to another advantageous embodiment, the first and second heat sinks are furthermore mechanically assembled together.

Another subject of the invention, according to another aspect thereof, is a method for operating a device as claimed in one of the preceding claims, comprising the following steps:
 turning off the thermoelectric module when the functional component is operating in the nominal regime; and
 turning on the thermoelectric module when the functional component is operating under thermal overload.

DETAILED DESCRIPTION

Other advantages and features of the invention will become more clearly apparent upon reading the detailed description of the invention, given by way of non-limiting illustration with reference to the following figures in which.

Figure 3:
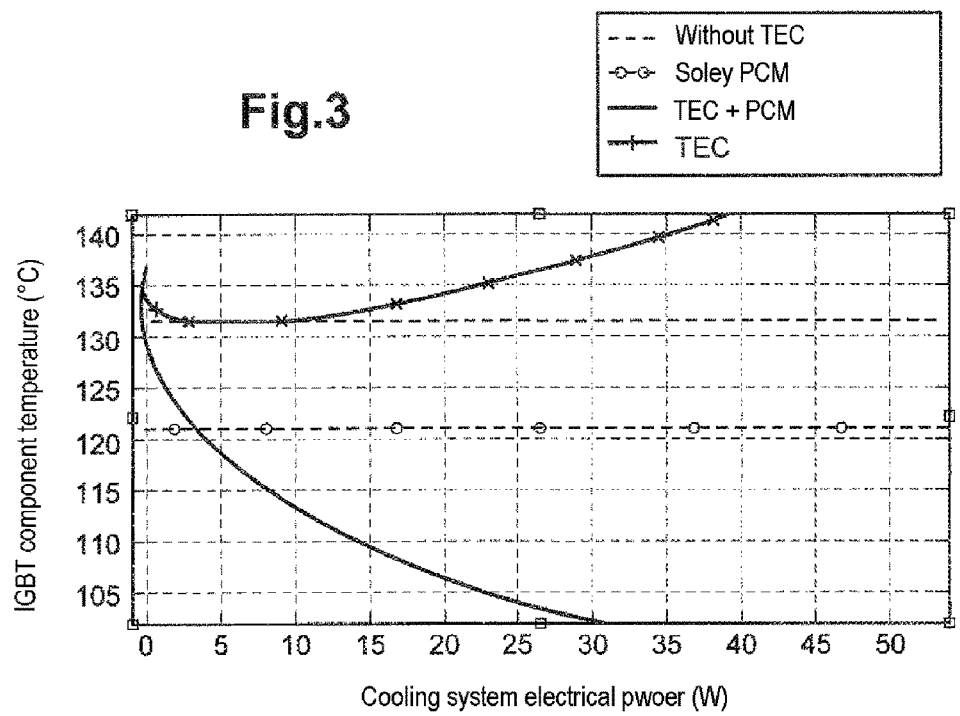
Figure 4:
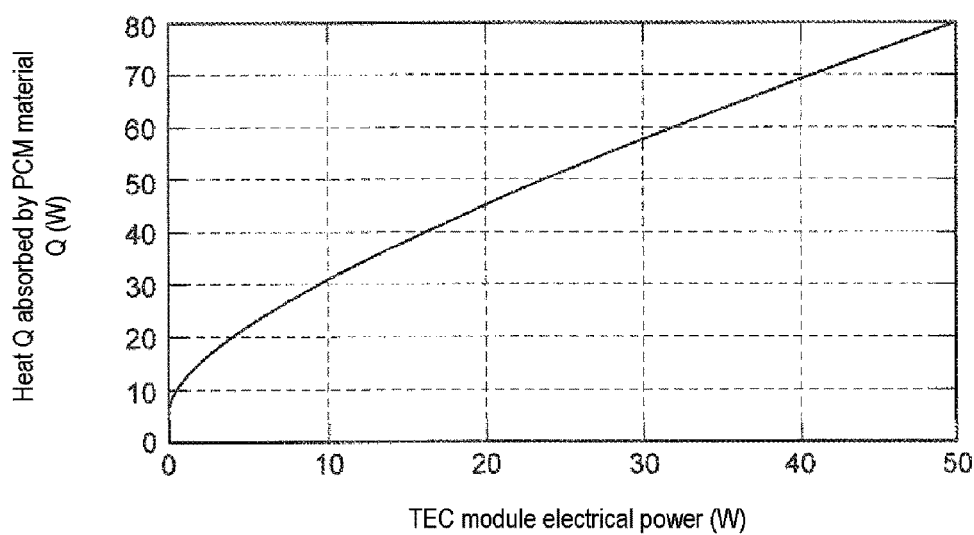

FIG. 3 shows the variation in the temperature of the junctions of a power component as a function of the electrical power used by the cooling system dedicated thereto in various configurations, namely respectively a system according to the prior art with solely one heat sink and no thermoelectric module and no PCM material; a system according to the prior art comprising a heat sink and solely one PCM material; a system according to the prior art comprising a heat sink and solely one thermoelectric module; and lastly a system according to the invention comprising a Peltier module and a heat sink containing a PCM material thermally coupled to the hot face of said module;

FIG. 4 shows the variation in the heat absorbed by a PCM material as a function of the electrical power of a Peltier module in a system for cooling a power component according to the invention;

FIG. 5 is a diagrammatic side view of a device comprising a power electronic component and the cooling system thereof according to one example of the invention;

FIG. 6 is a detailed view showing a portion of the system for cooling a power electronic component according to the invention;

FIG. 7 is a diagrammatic perspective view of a device comprising a power electronic component and the cooling system thereof according to the prior art, dimensioned to cool the component in the event of thermal overload.

For the sake of clarity, it will be noted that the same elements in a device according to the prior art and a device according to the invention are denoted by the same references.

Figure 1:
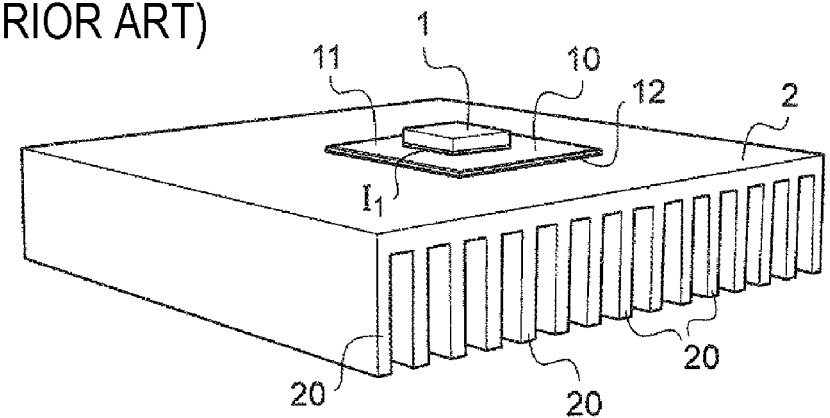
FIG. 1 is a diagrammatic perspective view of a device comprising an electronic component and the cooling system thereof according to the prior art.

FIG. 1 shows an assembly of an electronic component 1 and the substrate 10 thereof, which bears it and the cooling system thereof according to the prior art, the latter being composed solely of a heat sink 2 with vertical fins 20.

As shown, the electronic component has an interface I1 with one of the main faces 11 of the substrate 10, and the heat sink 2 has an interface I1 with the other main face 12 of the substrate 10. The interfaces I1 may be produced using a thermal interface material such as a thermal adhesive or an adhesive having a matrix made of a metal such as tin (Sn), or by means of a low-temperature solder of the tin- or indium (In)-based type.

The finned heat sink 2 is dimensioned to ensure the cooling of the component 1 which is powered by a given nominal current.

In certain applications, such as those involving driving a motor, electrical circuits employing a power component 1 are implemented. A component 1 such as this may be made of a material based on Si, SiC or GaN. It may consist in a single component or an assembly of single components. A single component such as this may be an insulated gate bipolar transistor (IGBT) or a diode. A power component 1 may therefore consist of an association of one or more IGBTs with one or more diodes on one and the same substrate 10.

In these applications, a power component 1 may be subjected to electrical overloads, as the power supply current thereof is then greater than that of the nominal current (typically equal to 110% of the nominal current) over relatively short periods, typically of about 1 to 5 min. An electrical overload translates into a substantial thermal overload of the component 1, with in particular a temperature of the junctions thereof which may be detrimental to the lifespan thereof.

Thus, it has proven to be necessary to remove this thermal overload.

An immediate solution might consist in adjoining, to the component 1, a supplementary finned heat sink, on the face thereof opposite the nominal heat sink 2: a solution such as this is diagrammatically shown in FIG. 7, in which the supplementary heat sink 2' is identical to the nominal heat sink 2.

A solution such as this is unviable, since, as is apparent from FIG. 7, the over-dimensioning of the cooling system 2, 2' is most considerable, since about double the volume required by the nominal cooling alone is required. This would make it impossible to integrate into the packaging of the component 1.

Figure 2:
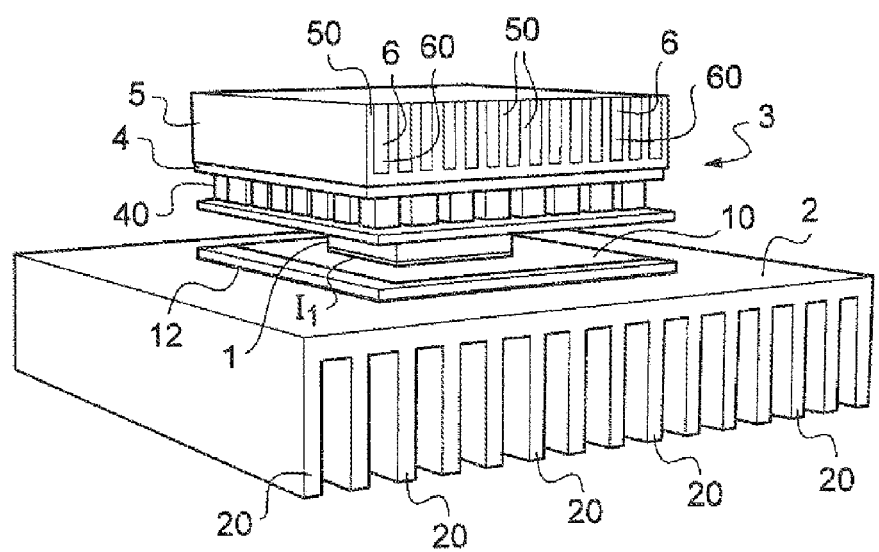
FIG. 2 is a diagrammatic perspective view of a device comprising a power electronic component and the cooling system thereof, according to the invention.

Thus, the inventors judiciously thought to produce a supplementary cooling system portion 3, as illustrated in FIG. 2.

The cooling system 3 according to the invention thus firstly comprises a Peltier module 4 the cold face 41 of which has an interface I2 with the component 1.

The Peltier module 4, typically made of bismuth telluride, is composed of a plurality of pairs of thermoelectric legs 40 that are thermally connected in parallel and electrically in series.

The system 3 furthermore comprises a supplementary heat sink 5 having an interface I3 with the hot face 42 of the Peltier module 4.

This supplementary heat sink 5 comprises an exchange surface, such as fins 50 which enable heat exchange with the surrounding environment, such as air or water, and, between two consecutive fins 50, a cell 6 containing a solid-liquid phase-change material (PCM) 60.

According to the invention, provision is made for:
the PCM material 60 contained in the cells 60 to be adapted to melt when the heat released from the cold face 41 of the Peltier module 4 is that of the component 1 in thermal overload;
the exchange surface defined by the fins 50 to be adapted to return the PCM material 60 from the molten phase thereof to the solid phase thereof when the heat released from the cold face 41 of the Peltier module 4 is that of the component 1 in operation which is not in thermal overload.

Thus, in nominal operation, solely the finned 20 heat sink 2 removes the heat from the power component 1. If there had previously been a thermal overload of the component 1, then the molten PCM material 60 gradually returns to the solid state thereof by removal of the heat which it had stored via the fins 50 of the supplementary heat sink 5.

When operating under thermal overload, the heat sink 50 reliably removes the surplus heat from the component 1.

Thus, according to the invention, a complete cooling system 2, 3 is obtained which is dimensioned so as to be compatible with the integration of the supplementary portion 3, 4, 5 into the packaging of the component 1.

In comparison with a solution with two heat sinks 2, 2' of comparable size according to FIG. 7, the solution according to the invention with a supplementary heat sink 5 of substantially smaller size has the main advantage of having a small bulk.

The inventors have been able to quantify the amount of space saved by a solution with a cooling system 2, 3 according to the invention relative to a solution with a cooling system 2, 2' according to the prior art as illustrated in FIG. 7.

The data are as follows:
component 1: electronic chip for which it is desired to limit the temperature to at most 100° C. in the nominal operating regime and at most 110° C. under thermal overload;
heat sink 2: thermal resistance of 1 K/W, volume of about 200 cm$^3$ for removing the 70 W of power and limiting the temperature of the chip 1 to 100° C.
Thermal calculations show:
heat sink 2': thermal resistance of 2 K/W, volume of about 100 cm$^3$ to remove an additional 50 W of power during a power spike and limiting the temperature of the component 1 to 110° C.;
cooling system according to the invention with heat sink 5, PCM material 60 and Peltier module 4: thermal resistance of about 10 K/W, volume of about 15 to 20 cm$^3$.

The PCM material 60 accounted for in the calculations is paraffin, the melting point of which is equal to 110° C., the latent heat of fusion of which is equal to 180 kJ/kg and the density of which is equal to 0.8 g/cm$^3$.

The Peltier module 4 accounted for in the calculations is composed of 324 thermoelectric legs made of bismuth telluride $Bi_2Te_3$, of unit dimensions equal to 1 mm$^2$*0.54 mm on both sides, produced on an AlN or $Al_2O_3$ substrate and the thermal resistance of which is equal to 1 K/W.

The present invention is certainly advantageous if the duration of the power spike is not too long, in total less than 10 min., as above that the chosen PCM material 60 requires an overly large expansion volume to store the required power.

It is observed that with the data shown, the volume of the supplementary portion 3 of the cooling system according to the invention, which allows for the heat spike to be removed, is decreased by about 50 to 60% compared with a conventional finned heat sink 2', which would be added as shown in FIG. 7.

The inventors also considered other solutions according to the prior art for removing surplus heat from the power component 1.

They thus calculated, via simulation, the variation in the temperature of the junctions of a power component 1 as a function of the electrical power used by a cooling system dedicated thereto in various configurations, namely respectively a system according to the prior art with solely one heat sink and no thermoelectric module and no PCM material; a system according to the prior art comprising a heat sink and solely one PCM material; a system according to the prior art comprising a heat sink and solely one thermoelectric module; and lastly a system 3 according to the invention comprising a Peltier module 4 and a heat sink 5 containing a PCM material 60 thermally coupled to the hot face 42 of said module. These various variations are shown in FIG. 3.

As for FIG. 4, it shows the variation in the heat absorbed by a PCM material as a function of the electrical power of a Peltier module in a system for cooling a power component according to the invention.

It is clearly apparent from FIGS. 3 and 4 that the combination of a Peltier module 4 and a PCM material 60 allows the cooling of the power components 1 to be improved compared with a single supplementary heat sink 2'. By way of indication, a cooling system according to the invention makes it possible to reduce the temperature of power components 1, such as IGBTs, by more than 20° C. compared with a cooling system with solely one supplementary heat sink 2'.

FIG. 5 shows in detail an assembly of the various components of a device integrating a power electronic component 1 and a complete cooling system, i.e. the heat sink dedicated to cooling in the nominal operating regime and the cooling system 3 according to the invention, which is dedicated to cooling under thermal overload.

In order to reliably produce this assembly, care must judiciously be taken to avoid remelting the solder of the power components 1 or of the thermoelectric legs 40 of the Peltier module 4 during assembly.

Conventionally, the thermoelectric legs 40 are assembled within a Peltier module using SnAgCu or SnPb solders having melting points of about 200° C. The interfaces I1 between power components 1 and substrate 10 and between substrate 10 and heat sink 2 are conventionally produced using a mixture of CuSn alloys (melting point m.p.=250-350° C.) by transient liquid phase soldering (TLPS), or of SnAgCu alloys (m.p.=217° C.) or of sintered Ag particles (production temperature T of about 250° C. but m.p.>600° C.).

The technique for assembling the cooling system 3 according to the invention must therefore not implement process temperatures higher than the temperatures of the soldering applied during assembly.

Thus, the interface I2 between the power component 1 and the module 4 and the interface I3 connecting the module 4 to the heat sink 5 containing the PCM 60 are advantageously produced using a thermal interface material which is a thermal adhesive or an adhesive having a metal matrix based on tin, or a low-temperature solder based on indium or tin. It goes without saying that care must be taken to ensure that the temperature of the process implemented for the interface I2 is below the melting point of the solder used to assemble the thermoelectric legs 40.

Moreover, FIG. 5 shows an advantageous assembly variant which makes it possible to rigidify it and guarantee greater robustness. Thus, provision may be made for a supplementary fixation device 7 between the two heat sinks 2 and 5. This device 7 may consist in tie rods 70 fixed onto one of the heat sinks, such as that referenced 2 in FIG. 5, which tie rods are screwed using nuts 71 to the other of the heat sinks, such as that referenced 5 in FIG. 5.

FIG. 6 shows an advantageous variant which allows the heat exchange between the cells 6 containing the PCM material 60, and the heat sink 5 incorporating them, to be improved. According to this variant, provision is made for a plurality of secondary fins 51 arranged within each cell 6. The exchange surface between the molten PCM material and the cooling fins 50 is thus increased and therefore allows the PCM material to return to the solid state more rapidly. Stated otherwise, the thermal reactivity of the cooling system according to the invention is thus increased.

Provision may be made for other variants and improvements without departing from the scope of the invention.

Thus, instead of main fins 50, it may be envisioned to use corrugations to define the adapted exchange surface of the heat sink 5 with the surrounding environment.

Moreover, it may be envisaged to integrate carbon nanotubes or metal wires into the PCM material in order to improve the overall thermal conductivity thereof, and thus obtain an improved percolation of the heat.

The invention is not limited to the examples just described; in particular, features of the illustrated examples may be combined in variants that have not been illustrated.

The invention claimed is:

1. A device comprising a functional component, liable to be thermally overloaded during the operation thereof, and a system for cooling the component, the cooling system comprising:
    a thermoelectric module, comprising two main faces, one called the cold face, and the other called the hot face, the cold face being thermally coupled to the component;
    a first heat sink, thermally coupled to the hot face of the thermoelectric module, the heat sink comprising an exchange surface with the surrounding environment and furthermore at least one cell containing a phase-change material (PCM), the PCM material contained in the cell(s) being adapted so as to melt when the heat released from the cold face of the thermoelectric module is that of the component under thermal overload, the exchange surface being adapted so as to return the PCM material from the molten phase thereof to the solid phase thereof when the heat released from the cold face of the thermoelectric module is that of the component in operation which is not under thermal overload.

2. The device as claimed in claim 1, the functional component being an electronic component.

3. The device as claimed in claim 2, the electronic component being a power electronic component based on silicon (Si), silicon carbide (SiC) or gallium nitride (GaN).

4. The device as claimed in claim 1, the thermoelectric module being a Peltier module.

5. The device as claimed in claim 1, the thermal resistance of the thermoelectric module being between 1 and 10 kelvin per watt (K/W) for a power of thermal overload of the component of 10 W.

6. The device as claimed in claim 1, the PCM material contained in the cell(s) being adapted so as to store a quantity of heat of between 0.1 to 5 kJ.

7. The device as claimed in claim 6, the PCM material being chosen from molten salts, fatty acids waxes or paraffins ($C_nH_{2n+2}$) and their derivatives; metals with low melting points based on In, Ga, Bi and Sn, preferably $Bi_{67}In_{33}$, SnIn, BiSnPb, GaInSn.

8. The device as claimed in claim 7, the molten salts having the formula $MgCl_2.6H_2O$ or $Mg(NO_3).6H_2O$.

9. The device as claimed in claim 7, the fatty acids being chosen among myristic acid (C14H28O2), palmitic acid (C16H32O2) or stearic acid (C18H36O2).

10. The device as claimed in claim 7, the metals with low melting points having the formula Bi67In33 or SnIn or BiSnPb or GaInSn.

11. The device as claimed in claim 1, the first heat sink comprising a plurality of main fins, the device comprising a cell containing the PCM material being delimited by two consecutive main fins.

12. The device as claimed in claim 1, comprising metal fibres or carbon nanotubes that are embedded in the PCM material.

13. The device as claimed in claim 11, the first heat sink comprising a plurality of secondary fins arranged within a cell containing the PCM material.

14. The device as claimed in claim 1, the cold face of the thermoelectric module having an interface with the component and the hot face of the thermoelectric module having an interface with a face of the first heat sink.

15. The device as claimed in claim 14, the interfaces being produced by applying a thermal interface material chosen from a thermal adhesive or having a metal matrix adhesive solder, or by soldering using a solder based on indium (In) or tin (Sn).

16. The device as claimed in claim 1, the component being borne by a face of a substrate, another face of the substrate interfacing with a second heat sink, of the finned type.

17. The device as claimed in claim 1, the first and second heat sinks furthermore being mechanically assembled together.

18. A method for operating a device as claimed in claim 1, comprising the following step:
    turning off the thermoelectric module when the functional component is operating in the nominal regime, and turning on the thermoelectric module when the functional component is operating under thermal overload.

* * * * *